US006503688B1

(12) United States Patent
Preece et al.

(10) Patent No.: US 6,503,688 B1
(45) Date of Patent: Jan. 7, 2003

(54) ELECTRON BEAM RESIST

(75) Inventors: Jon Andrew Preece, Birmingham (GB); Richard Edward Palmer, Stourbridge (GB); Alexander Phillip Robinson, Andover (GB); Toshihiko Kanayama, Ibaraki (JP); Tetsuya Tada, Ibaraki (JP)

(73) Assignees: The University of Birmingham, Birmingham (GB); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 09/868,274

(22) PCT Filed: Dec. 16, 1999

(86) PCT No.: PCT/GB99/04261

§ 371 (c)(1),
(2), (4) Date: Aug. 3, 2001

(87) PCT Pub. No.: WO00/36469

PCT Pub. Date: Jun. 22, 2000

(30) Foreign Application Priority Data

Dec. 17, 1998 (GB) .............................................. 9827798

(51) Int. Cl.[7] .................................................. G03C 5/00
(52) U.S. Cl. ..................... 430/270.1; 430/294; 430/296; 430/942
(58) Field of Search .............................. 430/270.1, 294, 430/296, 942

(56) References Cited

U.S. PATENT DOCUMENTS

| 3,961,102 A | * | 6/1976 | Ballantyne et al. ........... 427/43 |
| 5,202,216 A | | 4/1993 | Aotani et al. |
| 5,250,385 A | | 10/1993 | Kondo et al. |
| 5,561,026 A | * | 10/1996 | Aoki ........................... 430/196 |
| 5,650,261 A | * | 7/1997 | Winkle ..................... 430/270.1 |
| 5,798,197 A | * | 8/1998 | Paulus et al. .................. 430/56 |
| 5,889,141 A | * | 3/1999 | Marocco, III et al. ....... 528/423 |
| 5,932,391 A | * | 8/1999 | Ushirogouchi et al. .. 430/270.1 |
| 6,117,617 A | * | 9/2000 | Kanayama et al. ......... 430/296 |

FOREIGN PATENT DOCUMENTS

EP 0 527 376 A1 2/1993

OTHER PUBLICATIONS

A. P. G. Robinson, R. E. Palmer, T. Tada, T. Kanayama, J. A. Preece; A Fullerene Derivative as an Ellectron Beam Resist For Nanolithagraphy; Applied Physics Letters vol. 72, No. 11; pp. 1302–1304; Mar. 16, 1998; American Institute of Physics.

* cited by examiner

Primary Examiner—Janet Baxter
Assistant Examiner—Amanda C. Walke
(74) Attorney, Agent, or Firm—Michael Best & Friedrich LLP

(57) ABSTRACT

A high resolution patterning method of a resist layer is disclosed by patternwise irradiation of a resist layer with electron beam utilizing a polysubstituted triphenylene compound as the electron beam resist material, which is graphitized and made insoluble in both polar and non-polar organic solvents for electron doses greater than $2 \times 10^{-3}$ C/cm$^2$, and which undergoes cleavage of the adduct chains and extensive de-aromatization of the triphenylene core therefore enhancing the solubility in polar solvents only for electron doses between $3 \times 10^{-4}$ and $2 \times 10^{-3}$ C/cm$^2$. The thus formed positive or negative tone resist layer is highly resistant against dry etching to ensure the utility of the method in fine patterning work for the manufacture of semiconductor devices.

19 Claims, 4 Drawing Sheets

ELECTRON BEAM RESIST

BACKGROUND OF THE INVENTION

The present invention relates to an electron beam resist material and more particularly to a method for forming a finely patterned resist layer on a substrate surface using the electron beam resist material.

As is well known, the manufacturing process of various kinds of electronic or semiconductor devices such as ICs, LSIs and the like involves a fine patterning of a resist layer on the surface of a substrate material such as a semiconductor silicon wafer. This fine patterning process is conducted heretofore by the photolithographic method in which the substrate surface is uniformly coated with a positive or negative tone photoresist composition to form a thin layer of the photoresist composition and patternwise irradiation of the photoresist layer with actinic rays such as ultraviolet light followed by a development treatment to selectively dissolve away the photoresist layer in the areas exposed or unexposed, respectively, to the actinic rays leaving a patterned resist layer on the substrate surface. The thus obtained patterned resist layer is utilized as a mask in the subsequent treatment on the substrate surface such as etching.

Whilst the above mentioned patternwise exposure of the resist layer is traditionally conducted with ultraviolet light, the trend in recent years is that, along with the rapid progress of electronic technology toward higher and higher degrees of integration in semiconductor devices, the patterning of the resist layer is required to have an ever increasing fineness which can by accomplished only by using actinic rays having a shorter wavelength than the conventional ultraviolet light. Accordingly, it is now the case that, in place of the conventional ultraviolet light, electron beams, excimer laser beams and X-rays are used as the short-wavelength actinic rays.

As the principle ingredient of a resist material having sensitivity to electron beam irradiation, referred to as an EB resist hereinafter, proposals have been made heretofore for the use of various organic resinous materials such as methacrylic resin-based, polystyrene-based and novolac resin based materials. $C_{60}$ and its methanofullerene derivatives have previously been shown to be EB resists by the present inventors, Appl. Phys. Lett. volume 72, page 1302 (1998), but these are relatively large molecules. In the polystyrene-based negative-tone EB resist materials, for example, patterning of the resist layer is accomplished by the mechanism that irradiation of the resist layer with electron beams induces crosslinking or polymerization of the resin molecules so that the resist layer is made insoluble in a developer solution in the areas patternwise irradiated with the electron beams leaving a patterned resist layer on the substrate surface so that, as a natural consequence, the fineness of the patterning cannot be finer than the molecular dimensions of the resinous ingredient. In the novolac resin-based EB resist materials the changes in the solubility behaviour of the resist layer in an alkaline developer solution caused by the patternwise irradiation with electron beams is utilized. Again in this case the molecular area of the resinous ingredient is the limiting factor on the fineness of patterning since dissolution of the resist layer in the developer solution proceeds with resin molecules as the dissolving units. Thus, it can be accepted in the prior art that the resolution of patterning cannot be finer than several tens of nanometers at best because the molecules of the above mentioned resins mostly have a molecular size of at least a few nanometers. In the so-called chemical amplification type resist materials recently under development, furthermore, the patterning of the resist layer utilizes a mechanism involving diffusion of the reactive species generated by the irradiation through the resist layer, and it is far from possible therefore to obtain pattern resolution in the ten-nanometer order or finer. Accordingly, it is eagerly desired to develop an EB resist capable of giving higher pattern resolution of nanometer order fineness which would not be obtained with the above described prior art. EB resist systems.

In the methacrylic resin-based positive tone EB resist materials, on the other hand, the pattern resolution is not always under limitation by the molecular size of the resinous ingredient because the patterning of the resist layer is effected by the main chain scission of the resin molecules by the irradiation with electron beams so that a pattern resolution of fineness of about 10 nm has already been obtained. However, the effective fineness of the working resist layer cannot be so high because the resistance of the resist layer against dry etching is relatively poor so that the patterned resist layer cannot be used as formed as a masking resist against etching.

It would be a due guiding principle therefore that the above mentioned defects and problems in the prior art EB resist materials could be overcome when the EB resist comprises, as the principle ingredient, a compound of nanometer order molecular size having a sensitivity to electron beam irradiation and capable of giving a layer having excellent resistance against dry etching.

SUMMARY OF THE INVENTION

The present invention, which has been completed as a result of the inventors' extensive investigations undertaken along the lines of the above mentioned guide principle, has an object to provide a novel EB resist composition as well as a method for the formation of a finely patterned resist layer on a substrate surface utilizing the novel EB resist material by the patternwise irradiation of the resist layer with electron beams.

Thus, the novel EB resist composition provided by the invention comprises a polysubstituted triphenylene compound. The present invention further resides in the use of a polysubstituted triphenylene compound as an electron beam resist material.

A preferred EB resist composition comprises:
 (A) an organic solvent; and
 (B) a polysubstituted triphenylene compound dissolved in the solvent.

Further, a method of the present invention for the formation of a patterned resist layer on a substrate surface comprises the steps of:
 (a) forming a coating layer containing a polysubstituted triphenylene compound on the substrate surface;
 (b) irradiating the coating layer patternwise with electron beams; and
 (c) selectively removing regions of the thus patternwise irradiated coating layer.

The regions of the patternwise irradiated coating layer which are removed, may be the un-irradiated regions in the case where a negative development is required, or they may be the irradiated regions in the case where a positive tone development is required.

The regions of the patternwise irradiated coating layer are preferably removed by dissolving in an organic solvent.

Preferably, the coating layer is formed by:
 (i) coating the substrate surface with a solution of the polysubstituted triphenylene compound in an organic solvent; and
 (ii) evaporating the organic solvent from the coating to form the coating layer containing the polysubstituted triphenylene compound.

DETAILED DESCRIPTION OF THE PREFERRED EMBODIMENTS

Figure 1:
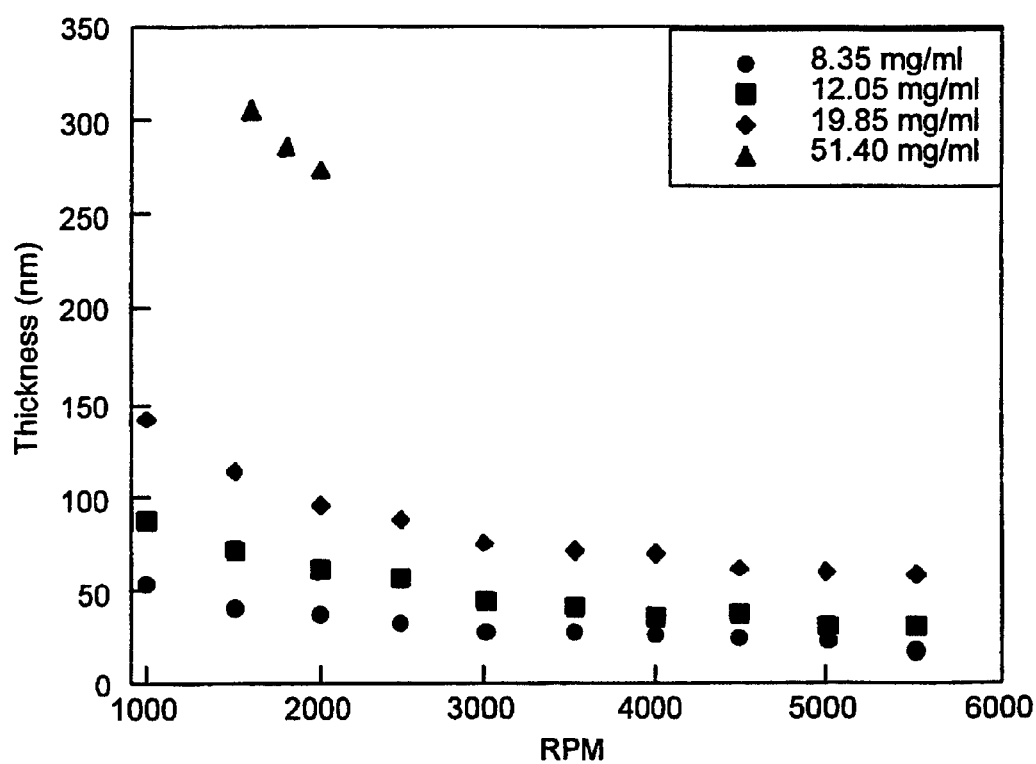
FIG. 1 is a graph showing the thickness of the coating layer formed by spin coating as a function of the coating solution concentration and the rotary speed of the spin coater determined in Example 1.

As a result of the extensive investigations undertaken with the above mentioned object, the inventors have arrived at an idea that a polysubstituted triphenylene compound having a diameter of between 1 and 3 nm would meet the above mentioned requirements for the high patterning resolution, and high etch durability.

The specific polysubstituted triphenylene compounds used as the principal ingredient of the EB resist in the present invention can be obtained via several chemical routes, notably those described in the papers by N. Boden et. al. Liquid Crystals volume 15, page 851 (1993) & S. Kumar et. al. Chem. Commun. 1997, page 1615. Such a polysubstituted triphenylene compound is expressed by the respective general structural formulae (1A) and (1B) given below, in which $R_1$ and $R_2$ are each, independently of each other, a monovalent organic group or hydrogen.

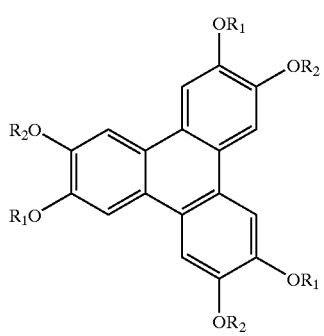

(1A)

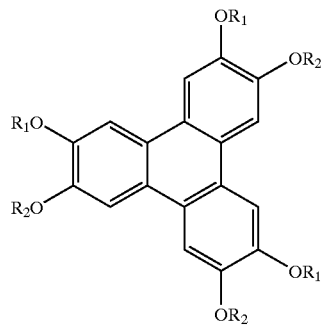

(1B)

The compounds expressed by the formulae (1A) and (1B) are respectively the symmetrical and the asymmetrical isomers of the compound. It is not always necessary to use a particular isomer of the polysubstituted triphenylene compound isolated from the other but a combination of these isomers can be used as such.

The above described polysubstituted triphenylene compounds can easily be prepared by one of several known methods, for example, the compound hexapentyloxytriphenylene (Compound 2(D)) is obtained by the treatment of 1,2-dipentyloxybenzene with ferric chloride in dichloromethane, in the presence of 0.3% sulphuric acid, followed by reduction of the product with methanol as described by N. Boden et. al. Liquid Crystals volume 15, page 851 (1993).

The R groups attached to the oxygen atoms may be substituted or unsubstituted alkyl groups, eg alkyl groups having from 1 to 10 carbon atoms, but it is considered that any other suitable group may be employed, eg a group which is capable of being cleaved from the oxygen atom by EB irradiation. Particular examples of the polysubstituted triphenylene compounds suitable for use in the present invention include those expressed by the structural formulae (2A) to (2O):

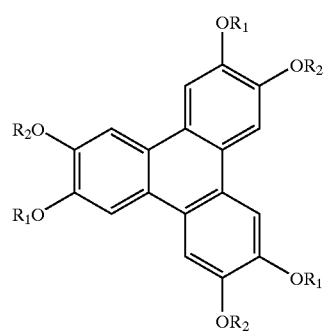

(2A to 2K)

(2A) $R_1 = C_5H_{11}$, $R_2 = C_2H_5$
(2B) $R_1 = C_5H_{11}$, $R_2 = C_3H_7$
(2C) $R_1 = C_5H_{11}$, $R_2 = C_4H_9$
(2D) $R_1 = C_5H_{11}$, $R_2 = C_5H_{11}$
(2E) $R_1 = C_5H_{11}$, $R_2 = C_6H_{13}$
(2F) $R_1 = C_5H_{11}$, $R_2 = C_7H_{15}$
(2G) $R_1 = C_5H_{11}$, $R_2 = C_9H_{19}$
(2H) $R_1 = C_6H_{13}$, $R_2 = C_6H_{13}$
(2I) $R_1 = C_7H_{15}$, $R_2 = C_3H_7$
(2J) $R_1 = C_8H_{17}$, $R_2 = C_2H_5$
(2K) $R_1 = C_5H_{11}$, $R_2 = C_5H_{10}COOH$

-continued

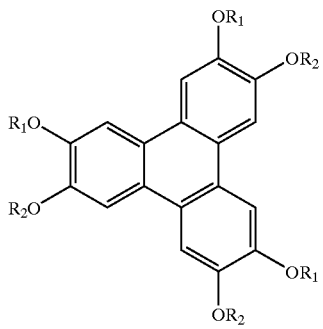

(2L to 2O)

(2L) $R_1 = C_5H_{11}$ $R_2 = C_1H_3$
(2M) $R_1 = C_7H_{15}$ $R_2 = C_3H_7$
(2N) $R_1 = C_8H_{17}$ $R_2 = C_2H_8$
(2O) $R_1 = C_5H_{11}$ $R_2 = H$

As will be understood from the above, the substituent groups are mostly alkyloxy groups, ie the linkage to the triphenylene rings is by an oxygen atom. However, it is also considered possible to use alkylthio groups or alkylester groups or even their thio equivalents.

It is an objective of a preferred aspect of the present invention to provide an electron beam resist material which, in un-irradiated form, is soluble in one type of solvent, eg an apolar organic solvent, but which is soluble in another type of solvent, eg a polar organic solvent, after it has been modified by EB irradiation. Thus, it may be advantageous in the present invention for at least some of the substituent groups on the triphenylene to be substantially apolar but modifiable to polar form when EB irradiated to a predetermined degree.

Examples of the formation of a patterned resist layer by using the EB resist composition according to the present invention will now be described.

In the first place, a uniform thin film containing the polysubstituted triphenylene compound is formed on the surface of a substrate which is not particularly limitative including those conventional in the fine patterning process for the manufacture of electronic devices such as semiconductor silicon wafers and gallium arsenide compound semiconductor wafers as well as those obtained by forming a coating film of silicon nitride, aluminium, indium oxide, titanium oxide and the like on these semiconductors wafers.

In the formation of a thin film of the polysubstituted triphenylene compound the preferred method, from the practical standpoint of convenience and simplicity, is the solution coating method in which a coating solution is prepared by dissolving the polysubstituted triphenylene compound in a suitable organic solvent, such as chloroform, toluene or monochlorobenzene and the substrate surface is coated with the coating solution, for example, on a spin coating machine and the solvent is evaporated. Other methods such as the Langmuir Blodgett method or vacuum sublimation may also be applicable. The polysubstituted triphenylene compound has sufficient solubility in various organic solvent that via the spin coating method films of thickness from less than 10 nm to more than 6000 nm can easily be produced.

In the next place, the thus formed thin coating film of the polysubstituted triphenylene compound on the substrate surface is irradiated patternwise with electron beams scanned according to a desired pattern or through a patterned mask bearing a desired pattern. The optimum irradiation dose of the electron beam depends on various factors including the particular polysubstituted triphenylene compound, and whether positive tone or negative tone resist behaviour is desired. For positive tone behaviour the required electron dose, assuming the energy of the electron beams to be 20 keV, may for example typically be between $\sim 2 \times 10^{-4}$ C/cm$^2$ and $\sim 3 \times 10^{-3}$ C/cm$^2$ for the compound 2D. For negative tone behaviour of the same compound, the required electron dose, assuming the energy of the electron beams to be 20 keV, may for example typically be at least $\sim 2 \times 10^{-3}$ C/cm$^2$. The upper limit of the irradiation dose for negative tone behaviour is, though not particularly limitative, around $1 \times 10^{-1}$ C/cm$^2$ from a practical standpoint.

The patternwise irradiation with electron beams causes, in the case of positive tone behaviour, an increase in the solubility of the resist layer in the irradiated areas for the appropriate developing solvent, or, in the case of negative tone behaviour, a reduction of the solubility of the resist layer in the irradiated areas for the appropriate developing solvent. At this point the resist layer can be processed either to demonstrate positive tone resist behaviour, or negative tone resist behaviour:

(a) Positive tone behaviour is demonstrated when the resist layer is subjected to a development treatment with a suitable organic solvent which dissolves away the resist layer in areas that have received a suitable dose, leaving the un-irradiated areas and areas that have received a dose either less than or greater than the lower and upper limits, respectively, for positive tone behaviour, as mentioned previously. Suitable solvents for positive tone behaviour are organic polar solvents such as iso propyl alcohol, 2-pentanol, 3-pentanol and hexyl alcohol. It should be noted that even for these polar organic solvents, at doses greater than the upper limit for positive tone behaviour, as previously mentioned, the response of the resist is negative tone.

(b) Negative tone behaviour is demonstrated when the resist layer is subjected to a development treatment with a suitable organic solvent with dissolves away the resist layer in the un-irradiated areas. Various kinds of organic solvents can be used as the negative tone developer including aromatic hydrocarbon solvents such as benzene, toluene, xylene and ethylbenzene, aliphatic halogenated hydrocarbon solvents such as methylene dichloride, ethylene dichloride, chloroform, and carbon tetrachloride and aromatic halogenated hydrocarbon solvents such as monochlorobenzene. The organic solvents can be used either singly or as a mixture according to need. It is particularly preferable to use monochlorobenzene as the negative tone developer in respect of very little occurrence of scum and residues in the un-irradiated areas after development, and high contrast of the patterned images.

The above described patterning process, with its duality of both positive and negative tone behaviour, utilizes the newly discovered mechanism that the polysubstituted triphenylene compound forming the resist layer is first subject to cleavage of the polysubstituted adducts, and hydrogenation of the core leading to the production of a polar hydroxylated moiety which is extensively de-aromatised, by lower electron doses, and then fragmentation and crosslinkage of the remaining material fragments by higher electron doses, which leads initially to enhanced solubility in polar solvents, and thence to reduced solubility in both polar and non-polar solvents. Accordingly, dependent on both the electron dose and the developing solvent employed, the film can be selectively removed in either the irradiated or the un-irradiated areas to leave a patterned resist layer having fidelity to the desired pattern. The development treatment is conducted by the immersion method which is most conventional and convenient but other methods such as the brush-out and the spraying method can also be applied.

After negative tone development the pattern has a graphitic structure which has a low sputtering rate against ion bombardment and high chemical stability in a plasma atmosphere containing chlorine or fluorine, and thus exhibits high resistance against dry etching, so that the patterned resist layer is useful as a mask in a high precision etching treatment of the substrate surface. The etching treatment of the substrate surface is advantageously undertaken by a process of dry etching, in particular, by the use of an electron cyclotron resonance microwave plasma etching instrument. In this way very fine patterning with high aspect ratio can easily be obtained.

In the following the method of the present invention for the formation of a patterned resist layer is described in more detail by way of Examples, which, however, never limit the scope of the invention in any way.

EXAMPLE 1

Four solutions were prepared at concentrations of 8.35 to 51.40 g/l by dissolving the polysubstituted triphenylene compound, shown by (2D), in chloroform. The solutions were used to coat several semiconductor silicon wafers using the spin coating method with rotary speeds in the range 1000 to 5500 rpm. In each case the solution was deposited onto the wafer which was then held at the relevant rotary speed for 60 seconds, by which point the solvent had completely evaporated. FIG. 1 of the accompanying drawing is a graph showing the thickness of the film as a function of the solution concentration and the rotary speed of the spin coater. It can be seen from FIG. 1 that by controlling either the rotary speed of the solution concentration it is possible, under the abovementioned conditions, to form coating layers in the range of 15 to 310 nm in thickness.

Figure 2:
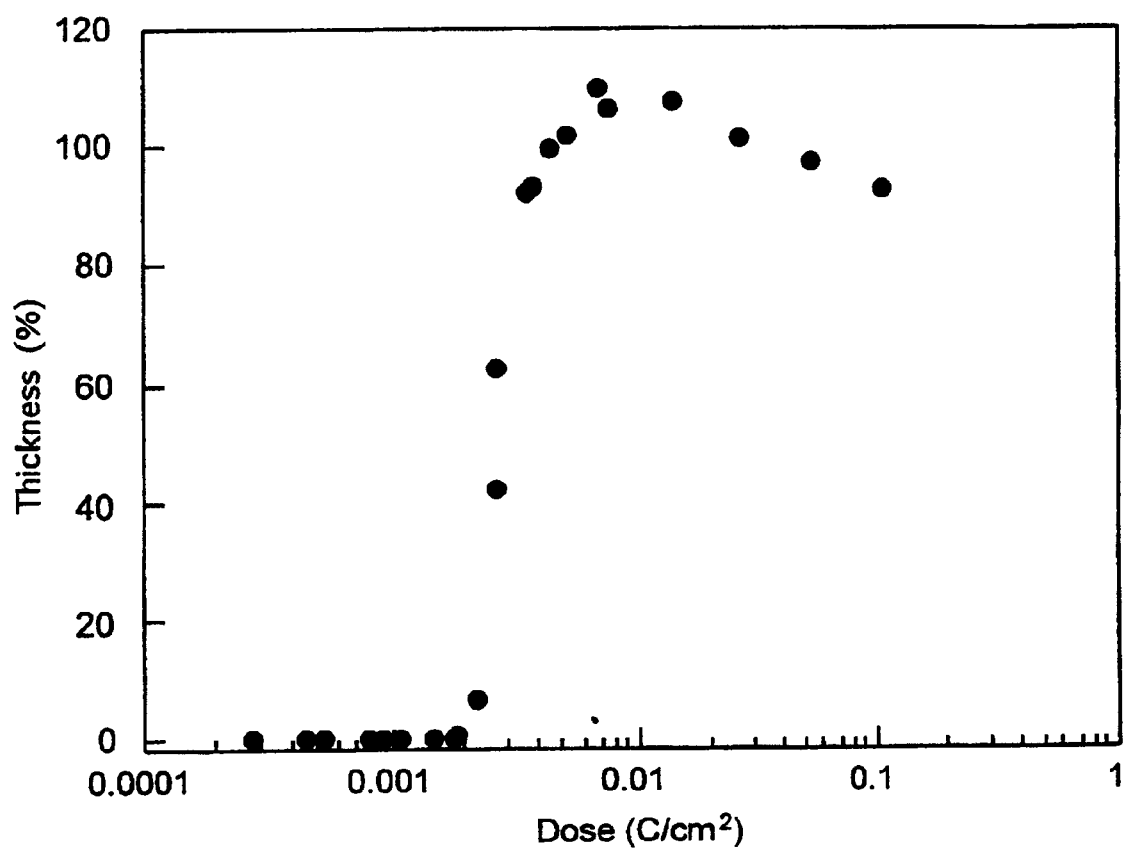
FIG. 2 is a graph showing the film thickness retention retention for the polysubstituted triphenylene compound (2D) after negative tone development as a function of the irradiation dose with electron beams on the resist layer determined in Example 1. The thickness is normalised as a percentage of the average film thickness for irradiation doses greater than $2 \times 10^{-3}$ C/cm$^2$.

Separately, a semiconductor silicon wafer was coated by spin coating with a 46.6 g/l concentration solution of the same polysubstituted triphenylene compound at a rotary speed of 1400 rpm for 60 seconds to form a dried coating layer having a thickness of approximately 300 nm. The thus formed coating layer was irradiated patternwise with electron beams of 20 keV, and with an electron dosage range of $1\times10^{-4}$ C/cm$^2$ to $1\times10^{-1}$ C/cm$^2$ followed by immersion in monochlorobenzene at room temperature for 60 seconds to effect negative tone development. After drying with nitrogen gas, the thickness of the remaining coating layer left un-dissolved by the monochlorobenzene in the irradiated areas, i.e. the film thickness retention, was determined to give the results shown in the graph of FIG. 2 as a function of the irradiation dose in a semilogarithmic scale. As is indicated by the graph, the film was made almost entirely insoluble with an irradiation dose of $2\times10^{-3}$ C/cm$^2$ or larger whilst the coating layer in areas which received a lower irradiation dose was entirely removed by the development. The loss of thickness at higher doses (greater than $2\times10^{-3}$ C/cm$^2$), seen in FIG. 2 was also seen before development as well as after, and is therefore indicative of compaction of the film caused by the electron beam irradiation, rather than film removal by the developing solution at these higher doses.

EXAMPLE 2

A 350 nm thick coating layer of the same polysubstituted triphenylene compound as used in Example 1 was formed on a semiconductor silicon wafer by the spin coating method and the thus formed coating layer was irradiated with electron beams of 20 keV energy on a 100 µm by 150 µm rectangular area with an irradiation dose varied from $1\times10^{-4}$ C/cm$^2$ to $1\times10^{-2}$ C/cm$^2$ followed by the development treatment in the same manner as Example 1 to form a patterned resist layer, of which the thickness, i.e. film thickness retention, was determined and is shown in Table I for two different irradiation doses.

With the thus patterned coating layer as a masking resist, the surface of the silicon wafer substrate was subjected to a dry etching treatment using electron cyclotron resonance microwave plasma etching using sulphur hexafluoride as the etchant with a flow rate of 5 sccm under a pressure of 0.4 mtorr with the application of 250 W of incident microwave power. The rf power supplied to the sample was 0.5 W/cm$^2$, and the etch was performed at 25 C. By this etching treatment approximately 2 µm of the surface layer was shaved off from the substrate whilst the masking resist layer was completely removed leaving a rectangular raised area having a height difference as shown in Table I. These results were used for the calculation of the etching resistance of the resist layer relative to the silicon surface to give the relative etching resistance shown in Table I. The etch ratio was seen to increase as the irradiation dose received by the resist layer increased, in such a way that although at higher doses the film remaining after development is thinner, for instance see FIG. 2, the height of the silicon structures remaining after etching is the same.

TABLE I

|  | Irradiation Dose $\times 10^{-3}$ C/cm$^2$ | |
| --- | --- | --- |
|  | 2.5 | 50 |
| Film thickness retention, nm | 344 | 50 |
| Height difference on silicon, nm | 1.090 | 1115 |
| Relative etching resistance | 3.2 | 4.4 |

For comparison, the same dry etching test was conducted with a commercially available novolac resin-based resist composition (SAL 601, a product by Shipley Co.) known as a resist of relatively high dry etching resistance. A 300 nm resist layer of the novolac resist was formed on a semiconductor silicon wafer by spin coating and irradiated with electron beams of 20 keV energy in an irradiation dose of $2.5\times10^{-5}$ C/cm$^2$ followed by the development treatment and dry etching treatment undertaken in the same manner as above. The relative etching resistance of this material to silicon was 3.

The above given experimental results support a conclusion that the resist layer formed from the specific polysubstituted triphenylene compound has a slightly higher relative etching resistance than the conventional novolac resin-based resist material, and is thus useful for fine patterning with high aspect ratio.

EXAMPLE 3

A 20 nm thick coating layer as dried of the same polysubstituted triphenylene compound as used in Example 1 was formed on the surface of a semiconductor silicon wafer by the spin coating method, and line and space patterns were defined in the resist using a 30 keV electron beam at a dose of 1.7 µC/m. The film was developed in the same manner as Example 1 and the patterns were examined with a scanning electron microscope. No residue was observed in the un-irradiated areas, and lines having a width of 10 nm were observed standing upright on the substrate surface.

EXAMPLE 4

Figure 3:
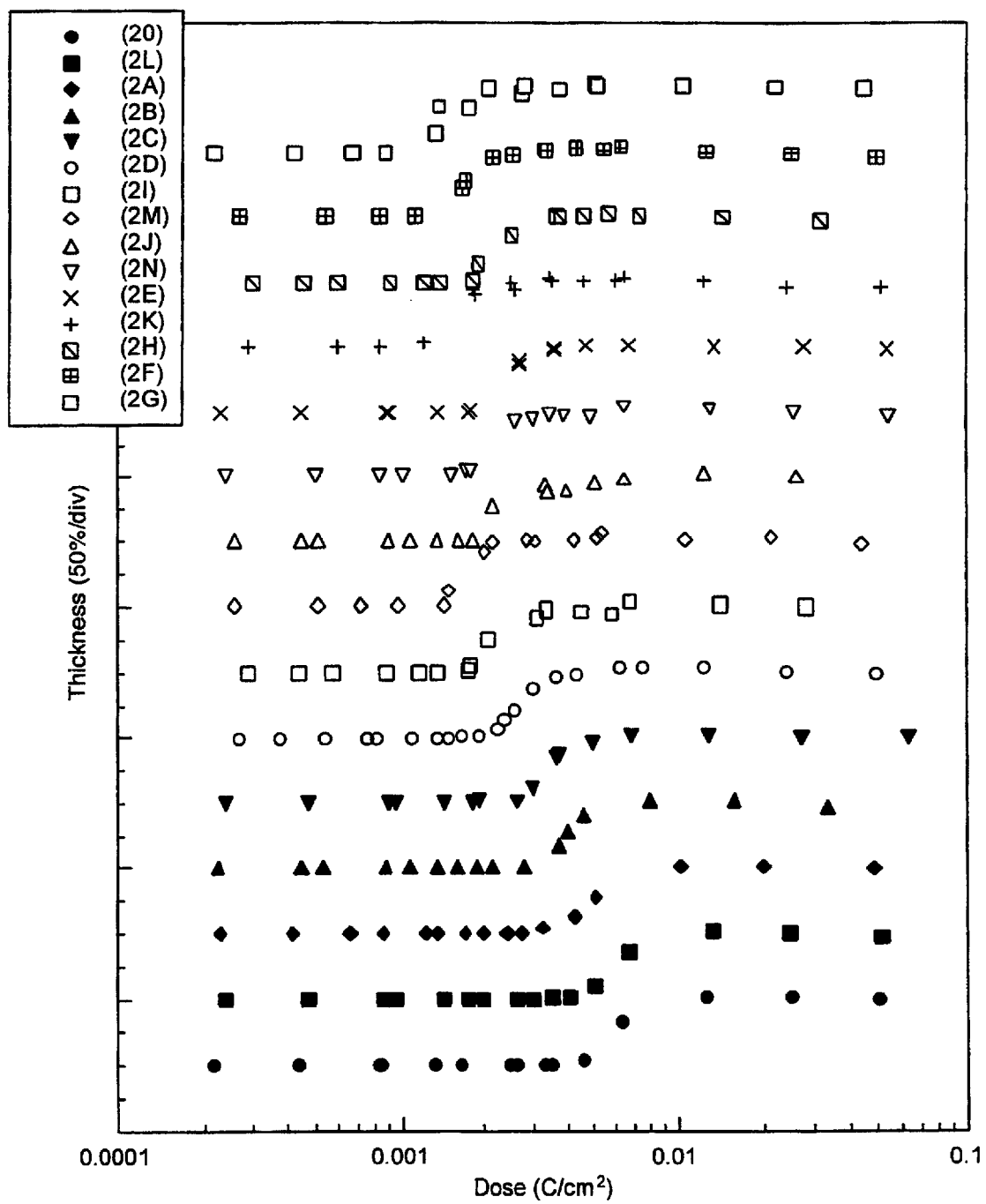
FIG. 3 is a graph showing the film thickness retention for the polysubstituted triphenylene compounds (2A to O) after negative tone development as a function of the irradiation dose with electron beams on the resist layer determined in Example 4. The thickness is normalized as a percentage of the respective average film thickness for irradiation doses greater than the second turning point for each of the plots.

The procedure for the formation of a patterned resist layer on a silicon surface in the same manner as Example 1 was repeated for each of the polysubstituted triphenylene compounds 2(A) to 2(O). The films were irradiated and developed as described in Example 1, and the film thickness retention is plotted against the irradiation dose in FIG. 3 of the accompanying drawing, for each of these polysubstituted triphenylene compound, (see key on FIG. 3).

This figure indicates that each of the polysubstituted triphenylene compounds shown are sensitive to electron irradiation, and that the sensitivity of the compounds is roughly proportional to the aggregate size of their adducts.

EXAMPLE 5

(a) The procedure for the formation of a patterned resist layer on a silicon surface in the same manner as Example 1 was repeated for the polysubstituted triphenylene compound used in Examples 1 to 3. The thus formed coating layer was irradiated patternwise with electron beams of 20 keV, and with an electron dosage range of $1 \times 10^{-5}$ C/cm$^2$ to $1 \times 10^{-2}$ C/cm$^2$ followed by immersion in 3-pentanol at room temperature for 2 seconds to effect positive tone development. After drying with nitrogen gas, the thickness of the remaining coating layer left un-dissolved by the 3-pentanol, i.e. the film thickness retention, was determined to give the results shown in the graph of FIG. 4 as a function of the irradiation dose in a semilogarithmic scale. As is indicated by the graph, the film was made almost entirely insoluble with an irradiation dose of $2 \times 10^{-3}$ C/cm$^2$ or larger as was previously seen for the developer monochlorobenzene. However, the un-irradiated areas was also seen to be insoluble in the 3-pentanol, whilst areas receiving a dose of between $3 \times 10^{-4}$ C/cm$^2$ and $3 \times 10^{-3}$ C/cm$^2$ exhibited an enhanced solubility in the 3-pentanol, showing that this polysubstituted triphenylene compound can also be used as a positive tone EB resist.

(b) A sample was prepared and irradiated as for Example 5(a) followed by immersion in 2-pentanol at room temperature for 2 seconds to effect positive tone development. After drying with nitrogen gas, the thickness of the remaining coating layer left un-dissolved by the 2-pentanol, i.e. the film thickness retention, was determined to give the results shown in the graph of FIG. 4 as a function of the irradiation dose in a semilogarithmic scale. As is indicated by the graph, the film was made almost entirely insoluble with an irradiation dose of $6 \times 10^{-3}$ C/cm$^2$ or larger as was previously seen for the developer monochlorobenzene. However, the un-irradiated areas was also seen to be insoluble in the 2-pentanol, whilst areas receiving a dose of between $1 \times 10^{-4}$ C/cm$^2$ and $6 \times 10^{-3}$ C/cm$^2$ exhibited an enhanced solubility in the 2-pentanol.

Figure 4:
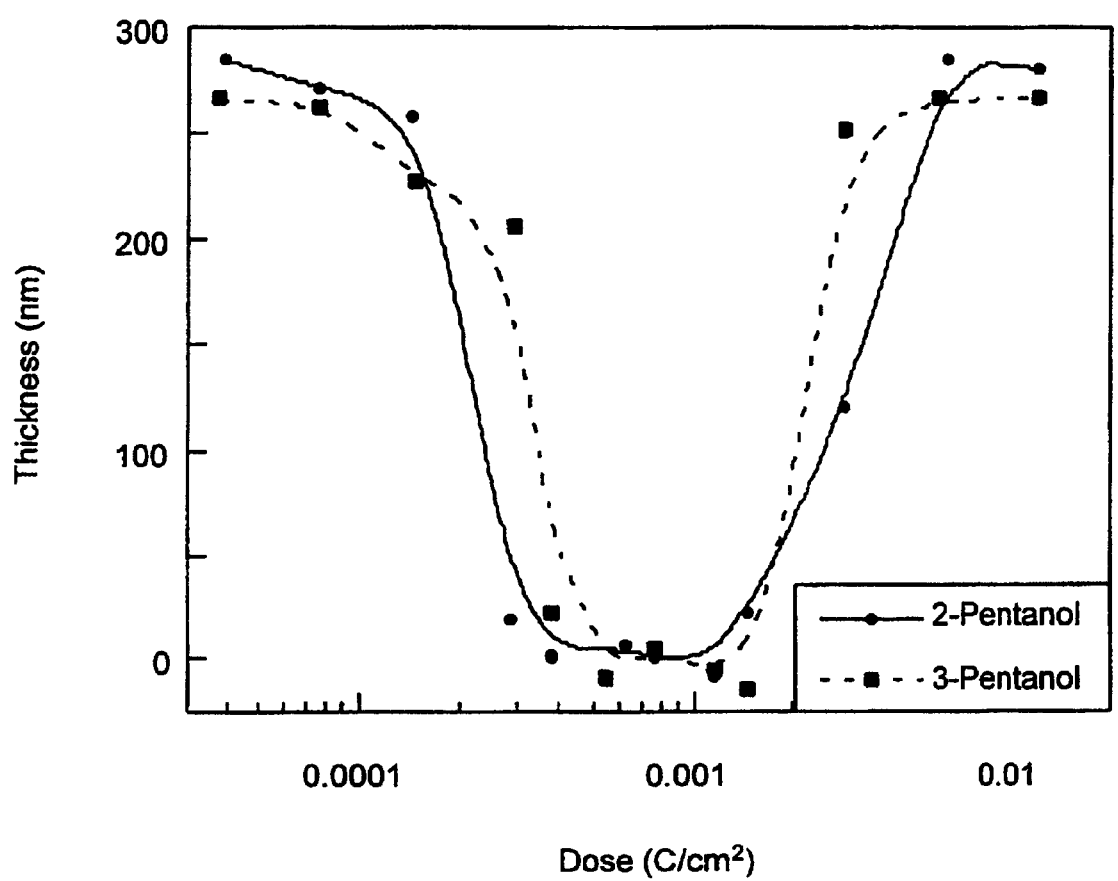
FIG. 4 is a graph showing the film thickness retention for the polysubstituted triphenylene compound (2D) after positive tone development as a function of the irradiation dose with electron beams on the resist layer determined in Example 5.

As can be seen from FIG. 4 both 2 and 3-pentanol are suitable positive developers for the polysubstituted triphenylene compound 2(D). The developer 3-pentanol exhibits higher contrast, which is indicative of high resolutions, whereas the developer 3-pentanol displays positive behaviour for a wider range of electron dosages, which allows for more process latitude in the irradiation step.

What is claimed is:

1. A method of forming a patterned resist layer on a substrate surface comprising:
    forming a coating layer containing a polysubstituted triphenylene compound on the substrate surface, the polysubstituted triphenylene compound being an electron beam resist material;
    irradiating the coating layer patternwise with electron beams; and
    selectively removing regions of the thus patternwise irradiated coating layer.

2. A method as claimed in claim 1, wherein the regions of the patternwise irradiated coating layer are removed by dissolving in an organic solvent.

3. A method as claimed in claim 2, in which the organic solvent is selected from the group consisting of chloroform, toluene and monochlorobenzene.

4. A method as claimed in claim 2, in which the organic solvent is a polar organic solvent.

5. A method as claimed in claim 4, wherein the polar organic solvent is selected from isopropyl alcohol, 2-pentanol, 3-pentanol and hexyl alcohol.

6. A method as claimed in claim 2, in which the organic solvent is a non-polar organic solvent.

7. A method as claimed in claim 6, wherein the non-polar organic solvent is a selected from aromatic hydrocarbon solvents, aliphatic halogenated hydrocarbon solvents and aromatic halogenated hydrocarbon solvents.

8. A method as claimed in claim 7, wherein the non-polar organic solvent is monochlorobenzene.

9. A method as claimed in claim 1, wherein the coating layer is formed by:
    (i) coating the substrate surface with a solution of the polysubstituted triphenylene compound in an organic solvent; and
    (ii) evaporating the organic solvent from the coating to form the coating layer containing the polysubstituted triphenylene compound.

10. A method as claimed in claim 1 in which the polysubstituted triphenylene compound is selected from the group consisting of the symmetric or asymmetric triphenylene derivatives expressed by the structural formulae:

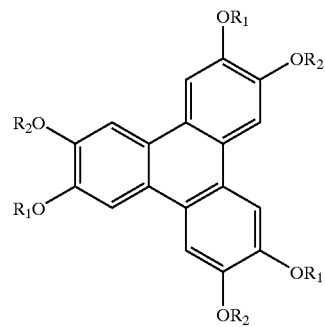

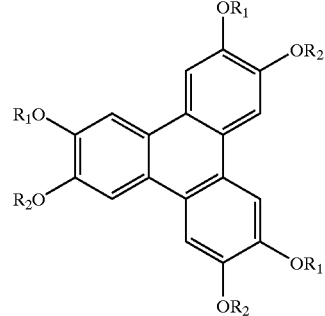

| General Formula | Example |
|---|---|
| $R_1 = C_nH_{2n+1}$, $R_2 = C_mH_{2m+1}$ | $R_1 = C_5H_{11}$, $R_2 = C_2H_5$ |
|  | $R_1 = C_5H_{11}$, $R_2 = C_3H_7$ |
|  | $R_1 = C_5H_{11}$, $R_2 = C_4H_9$ |
|  | $R_1 = C_5H_{11}$, $R_2 = C_5H_{11}$ |
|  | $R_1 = C_5H_{11}$, $R_2 = C_6H_{13}$ |
|  | $R_1 = C_5H_{11}$, $R_2 = C_7H_{15}$ |
|  | $R_1 = C_5H_{11}$, $R_2 = C_9H_{19}$ |
|  | $R_1 = C_6H_{13}$, $R_2 = C_6H_{13}$ |
|  | $R_1 = C_7H_{15}$, $R_2 = C_3H_7$ |
|  | $R_1 = C_8H_{17}$, $R_2 = C_2H_5$ |
| $R_1 = C_nH_{2n+1}$, $R_2 = C_mH_{2m}COOH$ | $R_1 = C_5H_{11}$, $R_2 = C_5H_{10}COOH$ |
| $R_1 = C_nH_{2n+1}$, $R_2 = H$ | $R_1 = C_5H_{11}$, $R_2 = H$ |

11. A method as claimed in claim 1, in which the polysubstituted triphenylene compound is a 2,3,6,7,10,11-substituted triphenylene wherein any one or more of the alkyl groups is optionally substituted.

12. A method as claimed in claim 1, in which the polysubstituted triphenylene compound is a 2,3,6,7,10,11-alkyloxytriphenylene wherein any one or more of the alkyl groups is optionally substituted.

13. A method as claimed in claim 1, in which the polysubstituted triphenylene compound is 2,3,6,7,10,11-hexa(pentyloxy)triphenylene.

14. A method as claimed in claim 1, in which the irradiation of the coating layer is conducted with an irradiation dose of between $3\times10^{-4}$ and $2\times10^{-3}$ C/cm².

15. A method as claimed in claim 1, in which the irradiation of the coating layer is conducted with an irradiation dose of at least $2\times10^{-3}$ C/cm².

16. A method as claimed in claim 1, wherein the pattern-wise irradiating step is conducted with a dose of electron beams such as to render the irradiated regions of the coating layer soluble in a positive tone organic solvent, and wherein the selective removal step is effected by dissolving the irradiated regions in the positive tone organic solvent.

17. A method as claimed in claim 1, wherein the pattern-wise irradiating step is conducted with a dose of electron beams such as to render the irradiated regions of the coating layer insoluble in a negative tone organic solvent, and wherein the selective removal step is effected by dissolving the non-irradiated regions in the negative tone organic solvent.

18. An electron beam resist composition comprising a triphenylene derivative.

19. A method of using a polysubstituted triphenylene compound as an electron beam resist material, the method comprising: providing a polysubstituted triphenylene compound, and using the polysubstituted triphenylene compound as an electron beam resist material.

* * * * *